(12) United States Patent
Theuss et al.

(10) Patent No.: US 12,196,825 B2
(45) Date of Patent: Jan. 14, 2025

(54) SENSOR DEVICES, ASSOCIATED PRODUCTION METHODS AND METHODS FOR DETERMINING A MEASUREMENT CURRENT

(71) Applicant: Infineon Technologies AG, Neubiberg (DE)

(72) Inventors: Horst Theuss, Wenzenbach (DE); Rainer Markus Schaller, Aichen (DE)

(73) Assignee: Infineon Technologies AG, Neubiberg (DE)

( * ) Notice: Subject to any disclaimer, the term of this patent is extended or adjusted under 35 U.S.C. 154(b) by 230 days.

(21) Appl. No.: 18/056,490

(22) Filed: Nov. 17, 2022

(65) Prior Publication Data

US 2023/0168318 A1 Jun. 1, 2023

(30) Foreign Application Priority Data

Dec. 1, 2021 (DE) .......................... 102021131638.3

(51) Int. Cl.
*G01R 33/07* (2006.01)
*G01R 33/02* (2006.01)
*G01R 33/09* (2006.01)

(52) U.S. Cl.
CPC ....... *G01R 33/072* (2013.01); *G01R 33/0206* (2013.01); *G01R 33/091* (2013.01)

(58) Field of Classification Search
None
See application file for complete search history.

(56) References Cited

U.S. PATENT DOCUMENTS

| 11,899,047 B1* | 2/2024 | Theuss ................... G01R 19/10 |
| 2006/0284613 A1 | 12/2006 | Hastings et al. |
| 2013/0076341 A1 | 3/2013 | Ausserlechner |
| 2013/0162245 A1 | 6/2013 | Tamura |
| 2015/0076636 A1* | 3/2015 | Beer ..................... H01L 23/293 257/427 |
| 2016/0380181 A1 | 12/2016 | Meyer et al. |

(Continued)

FOREIGN PATENT DOCUMENTS

| DE | 10051160 A1 | 5/2002 |
| DE | 10108640 A1 | 9/2002 |
| DE | 102004021862 A1 | 12/2005 |

(Continued)

*Primary Examiner* — Jermele M Hollington
(74) *Attorney, Agent, or Firm* — Harrity & Harrity, LLP

(57) ABSTRACT

A sensor device contains a first magnetic field sensor chip having a first sensor element. The first magnetic field sensor chip is configured to detect a component of a magnetic field at the location of the first sensor element. The sensor device contains a second magnetic field sensor chip having a second sensor element. The second magnetic field sensor chip is configured to detect a component of a magnetic field at the location of the second sensor element. The sensor device contains a current conductor configured to carry a measurement current that induces a magnetic field at the locations of the sensor elements. The magnetic field sensor chips and the current conductor are arranged relative to one another in such a way that an influence of a homogeneous magnetic stray field on the first components is compensated for upon difference formation or summation applied to the first components.

20 Claims, 5 Drawing Sheets

(56) References Cited

U.S. PATENT DOCUMENTS

| | | | |
|---|---|---|---|
| 2020/0003797 A1* | 1/2020 | Binder | G01R 33/091 |
| 2022/0397617 A1* | 12/2022 | Schaller | G01R 33/072 |

FOREIGN PATENT DOCUMENTS

| | | |
|---|---|---|
| DE | 10051160 B4 | 1/2007 |
| DE | 202019106894 U1 | 4/2020 |
| DE | 102019124396 B4 | 5/2021 |

\* cited by examiner

SENSOR DEVICES, ASSOCIATED PRODUCTION METHODS AND METHODS FOR DETERMINING A MEASUREMENT CURRENT

CROSS REFERENCE TO RELATED APPLICATION

This application claims priority to German Patent Application No. 102021131638.3 filed on Dec. 1, 2021, the content of which is incorporated by reference herein in its entirety.

TECHNICAL FIELD

The present disclosure relates to sensor devices and methods for producing such sensor devices. Furthermore, the present disclosure relates to methods for determining a measurement current.

BACKGROUND

Sensor devices may contain magnetic field sensor chips configured to detect magnetic fields induced by an electric measurement current flowing through a current conductor. The magnitude of the measurement current can then be determined based on the detected magnetic fields. A plurality of technical problems addressed should be taken into consideration equally in the design of such sensor devices. By way of example, magnetic stray fields may occur in specific environments and may undesirably influence and corrupt the measurements of the sensor devices. Manufacturers and developers of sensor devices constantly endeavor to improve their products and associated methods. It may be desirable, inter alia, to provide sensor devices, associated production methods and methods for determining measurement currents which work reliably and accurately despite magnetic stray fields that occur.

SUMMARY

Various aspects relate to a sensor device. The sensor device includes a first magnetic field sensor chip having a first sensor element, wherein the first magnetic field sensor chip is configured to detect a first component of a first magnetic field at the location of the first sensor element with respect to a first sensitivity direction. The sensor device furthermore includes a second magnetic field sensor chip separated from the first magnetic field sensor chip and having a second sensor element, wherein the second magnetic field sensor chip is configured to detect a first component of a second magnetic field at the location of the second sensor element with respect to the first sensitivity direction. The sensor device furthermore includes a current conductor configured to carry a measurement current, wherein the measurement current induces a magnetic field at the locations of the two sensor elements. The two magnetic field sensor chips and the current conductor are arranged relative to one another in such a way that an influence of a homogeneous magnetic stray field on the two detected first components is compensated for upon difference formation or summation applied to the two detected first components.

Various aspects relate to a method for producing a sensor device. The method includes arranging a first magnetic field sensor chip having a first sensor element, wherein the first magnetic field sensor chip is configured to detect a first component of a first magnetic field at the location of the first sensor element with respect to a first sensitivity direction. The method furthermore includes arranging a second magnetic field sensor chip separated from the first magnetic field sensor chip and having a second sensor element, wherein the second magnetic field sensor chip is configured to detect a first component of a second magnetic field at the location of the second sensor element with respect to the first sensitivity direction. The method furthermore includes arranging a current conductor configured to carry a measurement current, wherein the measurement current induces a magnetic field at the locations of the two sensor elements. The two magnetic field sensor chips and the current conductor are arranged relative to one another in such a way that an influence of a homogeneous magnetic stray field on the two detected first components is compensated for upon difference formation or summation applied to the two detected first components.

Various aspects relate to a method for determining a measurement current. The method includes detecting a first component of a first magnetic field at the location of a first sensor element of a first magnetic field sensor chip with respect to a first sensitivity direction. The method furthermore includes detecting a first component of a second magnetic field at the location of a second sensor element of a second magnetic field sensor chip, separated from the first magnetic field sensor chip, with respect to the first sensitivity direction. The method furthermore includes carrying a measurement current using a current conductor, wherein the measurement current induces a magnetic field at the locations of the two sensor elements. The method furthermore includes forming a difference between or sum of the two detected first components, wherein the two magnetic field sensor chips and the current conductor are arranged relative to one another in such a way that an influence of a homogeneous magnetic stray field on the two detected first components is compensated for upon the difference formation or summation applied to the two detected first components. The method furthermore includes determining the magnetic field induced by the measurement current based on the difference formation or summation applied to the two detected first components.

BRIEF DESCRIPTION OF THE DRAWINGS

Devices and methods in accordance with the disclosure are explained in greater detail below with reference to drawings. The elements shown in the drawings are not necessarily rendered in a manner true to scale relative to one another. Identical reference signs may designate identical components.

DETAILED DESCRIPTION

Figure 1:
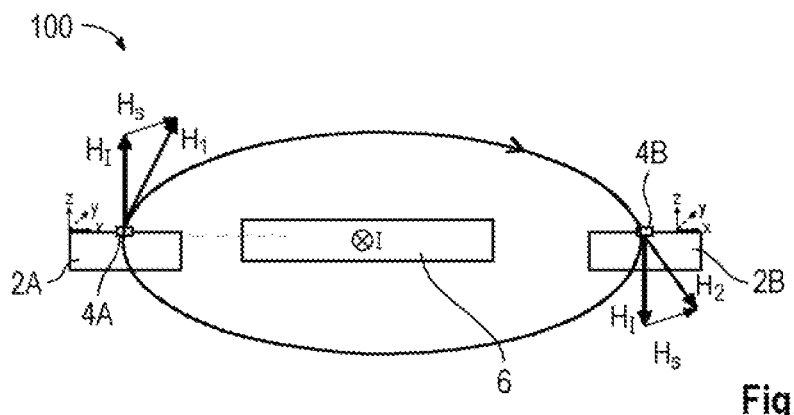
FIG. 1 shows a cross-sectional side view of a sensor device in accordance with the disclosure.

The sensor device 100 in FIG. 1 can comprise a first magnetic field sensor chip 2A having a first sensor element 4A and a second magnetic field sensor chip 2B having a second sensor element 4B. A current conductor 6 can be arranged between the two magnetic field sensor chips 2A and 2B. The current conductor 6 can be a busbar, for example.

During operation of the sensor device 100, an electric measurement current I can be carried by the current conductor 6. The measurement current I can induce a magnetic field $H_1$, which is indicated by way of example by a single elliptical magnetic field line in FIG. 1. In the example in FIG. 1, the technical current direction of the measurement current I can point into the plane of the drawing and the example field line of the induced magnetic field $H_1$ can run in the clockwise direction. In further examples, the technical current direction of the measurement current I can be inverted and point out of the plane of the drawing.

The current conductor 6 and the two magnetic field sensor chips 2A and 2B can be arranged relative to one another in such a way that the induced magnetic field $H_1$ in the case of the positions of the sensor elements 4A and 4B runs substantially parallel to the z-direction and has substantially an identical magnitude, but opposite signs. In this context, the upper main surfaces of the magnetic field sensor chips 2A and 2B and of the current conductor 6 can be arranged substantially parallel. The upper main surfaces of the magnetic field sensor chips 2A and 2B and the center of the current conductor 6 can be arranged substantially at an identical level, which is indicated by a horizontal dotted line in FIG. 1. The magnetic field $H_1$ induced at the locations of the sensor elements 4A and 4B is indicated in each case by a vertical vector arrow.

In addition to the induced magnetic field $H_1$, during operation of the sensor device 100 a magnetic stray field $H_s$ can occur, such as can be generated for example by current-carrying cables adjacent to the sensor device 100. In the example in FIG. 1, a homogeneous (or spatially homogeneous) magnetic stray field $H_s$ can be involved, which can be substantially identical on account of its homogeneity at the locations of the sensor elements 4A and 4B and is indicated by two identical vector arrows in FIG. 1. Effectively, in the case of the positions of the first sensor element 4A and the second sensor element 4B, a first magnetic field $H_1$ and a second magnetic field $H_2$, respectively, can then be present, each of which results from the vector sum of the induced magnetic field $H_1$ and the magnetic stray field $H_s$.

In the example in FIG. 1, each of the magnetic field sensor chips 2A and 2B can be a Hall sensor and each of the sensor elements 4A and 4B can be embodied as a Hall sensor element. The first magnetic field sensor chip 2A can be configured to detect a first component of the first magnetic field $H_1$ at the location of the first sensor element 4A with respect to a first sensitivity direction. In FIG. 1, the first magnetic field sensor chip 2A can be configured for example to detect the z-component $H_{1z}$ of the first magnetic field $H_1$ and to output a corresponding signal. In this case, the sensitivity direction of the first magnetic field sensor chip 2A can run substantially perpendicular to the upper main surface of the first magnetic field sensor chip 2A. In this case, the following can hold true:

$$H_{1z} = H_I + H_{sz} \tag{1}$$

Analogously, the second magnetic field sensor chip 2B can be configured to detect the z-component $H_{2z}$ of the second magnetic field $H_2$ and to output a corresponding signal. In this case, the following can hold true:

$$H_{2z} = -H_I + H_{sz} \tag{2}$$

The two magnetic field sensor chips 2A and 2B can each be configured to detect the magnitude and the sign of the magnetic field components $H_{1z}$ and $H_{2z}$, respectively.

Difference formation applied to the detected components or generation of a difference signal from the two signals output can result in the following:

$$H_{1z} - H_{2z} = H_I + H_{sz} - (-H_I + H_{sz}) = 2H_I \tag{3}$$

The induced magnetic field $H_1$ can thus be determined by difference formation applied to the two detected magnetic field components. The current conductor 6 and the two magnetic field sensor chips 2A and 2B can accordingly be arranged relative to one another in such a way that the influence of the homogeneous magnetic stray field $H_s$ on the two detected first components $H_{1z}$ and $H_{2z}$ is compensated for upon difference formation applied to the two detected first components $H_{1z}$ and $H_{2z}$.

In this context, it should be noted that in further examples the difference formation in equation (3) can be replaced by summation. By way of example, one of the two magnetic field sensor chips 2A and 2B can be turned over, as a result of which the sign of the magnetic field component detected by it or of the output signal would change. This change of sign can be taken into account by summation (instead of difference formation) applied to the two detected components, wherein the influence of the homogeneous magnetic stray field can once again be compensated for. The terms difference formation and summation can therefore be regarded as interchangeable in the examples described herein.

The following proportionality can result from equation (3):

$$H_1 \sim H_{1z} - H_{2z} \tag{4}$$

Furthermore, the following proportionality between the measurement current I and the magnetic field $H_1$ induced by it can hold true:

$$I \sim H_I \tag{5}$$

The following can result from relationships (4) and (5):

$$I \sim H_{1z} - H_{2z} \tag{6}$$

The measurement current I can thus likewise be determined by the sensor device 100 based on the difference formation applied to the two detected magnetic field components. The sensor device 100 can therefore also be referred to as a current sensor. The proportionality factor required therefor can be ascertained during a calibration of the sensor device 100, for example.

In the sensor device 100, the two magnetic field sensor chips 2A and 2B can be separated from one another, e.g. can correspond to components separated from one another. In particular, the two magnetic field sensor chips 2A and 2B can be spatially separated from one another. The two magnetic field sensor chips 2A and 2B can be in particular different semiconductor substrates. Consequently, rather than being integrated in a single semiconductor component, the sensor elements 4A and 4B can be integrated in semiconductor components separate from one another. In contrast thereto, in conventional sensor devices (not shown) sensor elements can be integrated in a single magnetic field sensor chip.

In comparison with conventional sensor devices, the following technical effects can be provided, inter alia, by the sensor device 100. The same can also hold true for all further sensor devices described herein in accordance with the disclosure.

On account of the magnetic field sensor chips 2A and 2B being embodied in a manner separated from one another, the intervening current conductor 6 can have a large cross section. On account of the large cross section, the current conductor 6 can provide a low electrical resistance or a high current-carrying capacity, such that high electric currents can be measured by the sensor device 100. At the same time, the magnetic field components induced in the case of the positions of the sensor elements 4A and 4B can be of sufficient magnitude that a high resolution of the current measurements carried out can be achieved. The sensor device 100 can thus be able to measure high electric currents with a high accuracy. The current measurement range of the sensor device 100 can be increased as a result. In addition to what has been stated, the measurement results of the sensor device 100 cannot be corrupted or can only be marginally corrupted by homogeneous magnetic stray fields.

In comparison with the sensor device 100, an accurate measurement of such high currents cannot be provided by conventional sensor devices. If a current conductor having a large cross section is chosen in such a device, it is not possible to provide a large variation of the z-components of the induced magnetic field between two sensor elements integrated in a single magnetic field sensor chip. The measurement accuracy is reduced as a result. The aforementioned large variation of the z-components of the induced magnetic field that is required for an accurate measurement can be achieved in a conventional sensor device if a section of the current conductor running in the vicinity of the sensor elements of the single magnetic field sensor chip is tapered. However, as a result of such tapering of the current conductor, high electrical resistances of the current conductor occur in the course of the tapering, as a result of which a measurement of high currents can be at least made more difficult.

Figure 2:
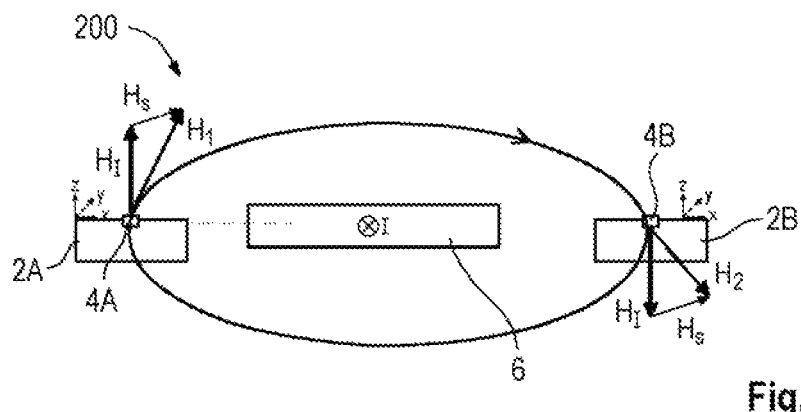
FIG. 2 shows a cross-sectional side view of a sensor device in accordance with the disclosure.

The sensor device 200 in FIG. 2 can be at least partly similar to the sensor device 100 in FIG. 1 and have identical features. In contrast to FIG. 1, the magnetic stray field $H_s$ in the example in FIG. 2 can be an inhomogenous (or spatially inhomogenous) magnetic stray field $H_s$, which can be non-identical on account of its inhomogeneity at the locations of the sensor elements 4A and 4B. In the example in FIG. 2, the vectors indicating the magnetic stray field $H_s$ in the case of the sensor elements 4A and 4B can have substantially an identical direction, but different lengths.

In addition to the detection of the z-components of the magnetic fields $H_1$ and $H_2$ as already described in association with FIG. 1, in the sensor device 200 in FIG. 2 each of the magnetic field sensor chips 2A and 2B can furthermore be configured to detect further components of the magnetic fields $H_1$ and $H_2$ at the locations of the sensor elements 4A and 4B, respectively, with respect to further sensitivity directions. By way of example, each of the magnetic field sensor chips 2A and 2B can be configured to detect the x- and/or y-component of the magnetic fields $H_1$ and $H_2$, respectively, and to output corresponding signals.

The magnetic field $H_1$ detected by the first magnetic field sensor chip 2A in the case of the first sensor element 4A can result as $$H_1 = \begin{pmatrix} H_{1x} \\ H_{1y} \\ H_{1z} \end{pmatrix} = \begin{pmatrix} 0 \\ 0 \\ H_I \end{pmatrix} + \begin{pmatrix} H_{S1x} \\ H_{S1y} \\ H_{S1z} \end{pmatrix} \quad (7)$$

Analogously, the magnetic field $H_2$ detected by the second magnetic field sensor chip 2B in the case of the second sensor element 4B can result as $$H_2 = \begin{pmatrix} H_{2x} \\ H_{2y} \\ H_{2z} \end{pmatrix} = \begin{pmatrix} 0 \\ 0 \\ -H_I \end{pmatrix} + \begin{pmatrix} H_{S2x} \\ H_{S2y} \\ H_{S2z} \end{pmatrix} \quad (8)$$

It can be assumed hereinafter that the inhomogenous magnetic stray field $H_s$ changes linearly to the same degree in all three spatial directions x, y and z. The magnetic stray field $H_s$ at the location of the second sensor element 4B can thus correspond to the magnetic stray field $H_s$ at the location of the first sensor element 4A plus a linear correction term with a correction factor a, e.g.

$$H_{s2} = H_{s1} + aH_{s1} = (a+1)H_{s1} \quad (9)$$

Assuming equation (9) results in the following for the magnetic field $H_2$ in equation (8):

$$H_2 = \begin{pmatrix} H_{2x} \\ H_{2y} \\ H_{2z} \end{pmatrix} = \begin{pmatrix} 0 \\ 0 \\ -H_I \end{pmatrix} + (a+1)\begin{pmatrix} H_{S1x} \\ H_{S1y} \\ H_{S1z} \end{pmatrix} \quad (10)$$

The x-components of vector equations (7) and (10) correspond to two equations, from which the correction factor a can be calculated as $$a = \frac{H_{2x}}{H_{1x}} - 1 \quad (11)$$

Furthermore, the z-components of vector equations (7) and (10) correspond to two equations. With the aid of equation (11) and the z-component of vector equation (7), it is possible to eliminate the correction factor a and the stray field component $H_{S1z}$ in the z-component of vector equation (10). Rearrangements result in the following for the induced magnetic field:

$$H_I = \frac{H_{1z}H_{2x} - H_{2z}H_{1x}}{H_{1x} + H_{2x}} \quad (12)$$

Further rearrangements make it possible to express the induced magnetic field $H_1$ in accordance with $$H_I = H_{1z} - H_{2z} + \frac{H_{2z}H_{2x} - H_{1z}H_{1x}}{H_{2x} + H_{1x}} \quad (13)$$

It is evident from each of equations (12) and (13) that the sensor device 200 under the influence of the inhomogenous magnetic stray field $H_s$ can be configured to determine the induced magnetic field $H_1$ based on the x- and z-components of the magnetic fields $H_1$ and $H_2$ detected by the magnetic field sensor chips 2A and 2B. In this case, the measurement results of the sensor device 200 cannot be corrupted (or can at least only be marginally corrupted) by the inhomogenous magnetic stray field $H_s$. In other words, the sensor device 200 can provide stray-field-robust measurements. In the present case, the influence of the inhomogenous stray field $H_s$ on a measurement result can be compensated for with use of a 2D magnetic field sensor chip configured to detect the x- and z-components of the magnetic fields $H_1$ and $H_2$. It is not absolutely necessary to detect the y-component for this purpose.

On account of the proportionality of relationship (5), the magnitude of the measurement current I can furthermore be determined from the detected magnetic field components. It is evident from equation (13) that the sensor device 200 under the influence of the inhomogenous magnetic stray field can be configured to determine the induced magnetic field $H_1$ (and thus the measurement current I) based on the difference formation $H_{1z} - H_{2z}$, known for the case of a homogenous stray field, plus a correction term $$\frac{H_{2z}H_{2x} - H_{1z}H_{1x}}{H_{2x} + H_{1x}}.$$

As an alternative to equation (11), the correction factor a can be calculated from two equations, resulting from the y-components of vector equations (7) and (10), as $$a = \frac{H_{2y}}{H_{1y}} - 1 \quad (14)$$

Analogously to equations (12) and (13), expressions for the induced magnetic field $H_1$ can be calculated using equation (14) and the z-components of vector equations (7) and (10) as $$H_I = \frac{H_{1z}H_{2y} - H_{2z}H_{1y}}{H_{1y} + H_{2y}} \quad (15)$$

and $$H_I = H_{1z} - H_{2z} + \frac{H_{2z}H_{2y} - H_{1z}H_{1y}}{H_{2y} + H_{1y}} \quad (16)$$

Proceeding from equations (15) and (16), the sensor device 200 under the influence of the inhomogenous magnetic stray field $H_s$ can be configured to determine the induced magnetic field $H_1$ based on the y- and z-components of the magnetic fields $H_1$ and $H_2$ detected by the magnetic field sensor chips 2A and 2B. In this case, the influence of the inhomogenous magnetic stray field $H_s$ on a measurement result can be compensated for by the use of a 2D magnetic field sensor chip configured to detect the y- and z-components of the magnetic fields $H_1$ and $H_2$. It is not absolutely necessary to detect the x-component in this case.

If the detected magnetic field component $H_{1x}$ has a very small value, the value for a in equation (11) can become very large and a determination of the induced magnetic field $H_1$ based on equations (12) and (13) can be inaccurate and unsuitable. Analogously, a determination of the induced magnetic field $H_1$ based on equations (15) and (16) can be problematic if the detected magnetic field component $H_{1y}$ has a very small value and the value for a in equation (14) becomes very large. In order to take account of this problem, the sensor device 200 in one example can be configured to decide whether the induced magnetic field $H_1$ is determined either based on one of equations (12) and (13) or based on one of equations (15) and (16). By way of example, the sensor device 200 can firstly determine the values for the two magnetic field components $H_{1x}$ and $H_{1y}$ and establish which of the two values is greater. If $H_{1x} > H_{1y}$ holds true, the induced magnetic field $H_1$ can be determined based on one of equations (12) and (13). If $H_{1y} > H_{1x}$ holds true, the induced magnetic field $H_1$ can be determined based on one of equations (15) and (16). In order to be able to provide the above-described decision and subsequent determination of the induced magnetic field $H_1$, the magnetic field sensor chips 2A and 2B can be in particular 3D magnetic field sensor chips.

Figure 3:
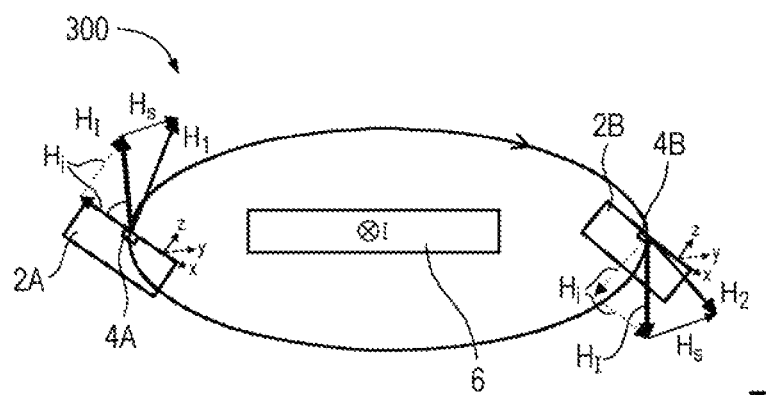
FIG. 3 shows a cross-sectional side view of a sensor device in accordance with the disclosure.

The sensor device 300 in FIG. 3 can be at least partly similar to the sensor device 200 in FIG. 2 and have identical features. Analogously to FIG. 2, in the example in FIG. 3, the magnetic stray field $H_s$ can be an inhomogenous magnetic stray field $H_s$. In comparison with FIG. 2, each of the two magnetic field sensor chips 2A and 2B in FIG. 3 can be rotated by an angle. As a result, the upper main surfaces of the magnetic field sensor chips 2A and 2B can be tilted relative to the current conductor 6 by a first and second tilt angle, respectively. In the example in FIG. 3, each of the two magnetic field sensor chips 2A and 2B can be rotated by an example angle of approximately 45 degrees in the clockwise direction, e.g. the tilt angles can each have a value of approximately 45 degrees. In further examples, the values of the angles can be chosen differently.

The magnetic field $H_1$ detected by the first magnetic field sensor chip 2A in the case of the first sensor element 4A can result as $$H_1 = \begin{pmatrix} H_{1x} \\ H_{1y} \\ H_{1z} \end{pmatrix} = \begin{pmatrix} -H_i \\ 0 \\ H_i \end{pmatrix} + \begin{pmatrix} H_{S1x} \\ H_{S1y} \\ H_{S1z} \end{pmatrix} \quad (17)$$

Analogously, the magnetic field $H_2$ detected by the second magnetic field sensor chip 2B in the case of the second sensor element 4B can result as $$H_2 = \begin{pmatrix} H_{2x} \\ H_{2y} \\ H_{2z} \end{pmatrix} = \begin{pmatrix} H_i \\ 0 \\ -H_i \end{pmatrix} + (\alpha + 1)\begin{pmatrix} H_{S1x} \\ H_{S1y} \\ H_{S1z} \end{pmatrix} \quad (18)$$

In the example in FIG. 2, the induced magnetic field $H_1$ was contained completely in the z-components of equations (7) and (10). In contrast thereto, in the example in FIG. 3, the induced magnetic field $H_i$ is divided uniformly between the x- and z-components of equations (17) and (18). For an example angle of 45 degrees, the following can hold true:

$$\frac{H_i}{H_I} = \sin\frac{\pi}{4} = \cos\frac{\pi}{4} \qquad (19)$$

Such a (in particular uniform) division of the induced magnetic field between two spatial components of the equations can contribute to shifting the field components of the induced magnetic field into suitable measurement ranges of the magnetic field sensor chips 2A and 2B.

In a similar manner to the example in FIG. 2, from equations (17) and (18) it is possible to calculate the correction factor a as $$a = \frac{-H_{1x} - H_{2x} + H_{1z} - H_{2z}}{H_{1x} + H_{1z}} \qquad (20)$$

and the portion $H_i$ of the induced magnetic field as $$H_i = \frac{H_{1z}H_{2x} - H_{2z}H_{1x}}{H_{1x} + H_{2x} + H_{1z} + H_{2z}} \qquad (21)$$

Based on the proportionality $$I \sim H_i \qquad (22)$$

the magnitude of the measurement current I can again be determined from the detected magnetic field component $H_1$.

It is evident from equation (21) that the sensor device 300 under the influence of the inhomogenous magnetic stray field can be configured to determine the component $H_1$ of the induced magnetic field $H_1$ based on the x- and z-components of the magnetic fields $H_1$ and $H_2$ detected by the magnetic field sensor chips 2A and 2B. An influence of the inhomogenous magnetic stray field $H_s$ on measurements carried out can once again be compensated for. It goes without saying in this context that the sensor device 300 can likewise be configured to compensate for an influence of a homogenous magnetic stray field. In such a case, e.g. for the condition a=0, the following can hold true:

$$H_i = \frac{H_{1x} - H_{2x}}{2} = \frac{H_{1z} - H_{2z}}{2} \qquad (23)$$

In the preceding examples, the induced magnetic field and the measurement current can be determined from the detected magnetic field components with the aid of the equations discussed. In this case, corresponding calculations can be carried out by various components. In one example, at least one of the two magnetic field sensor chips 2A and 2B can be configured to carry out one or more of these calculations. For this purpose, the magnetic field sensor chips 2A and 2B can be electrically connected to one another in order to be able to exchange detected magnetic field components between one another.

In a further example, a logic chip can be configured to logically process measurement signals provided by the magnetic field sensor chips 2A and 2B and to calculate the desired variables. The logic chip can, for example, be an ASIC (Application Specific Integrated Circuit). The logic chip can be regarded as part of the sensor device and can be arranged for example together with the magnetic field sensor chips 2A and 2B and the current conductor 6 in a common housing. In this case, the logic chip and the magnetic field sensor chips 2A and 2B can be electrically connected to one another within the housing. Alternatively, the logic chip can be a component which is separate from the sensor device and which can be arranged for example on the same circuit board (not shown) as the sensor device. In this case, an electrical connection between the logic chip and the sensor device or the magnetic field sensor chips 2A and 2B can be provided via the circuit board.

Figure 4A:
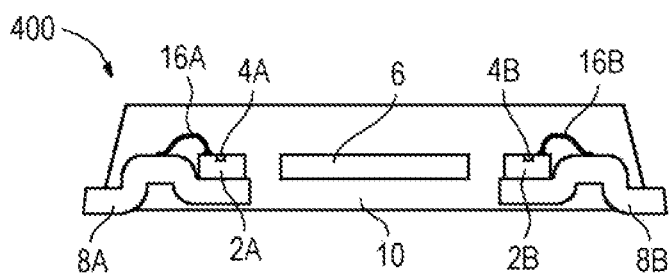
FIGS. 4A and 4B show a cross-sectional side view and a plan view, respectively, of a sensor device in accordance with the disclosure.
Figure 4B:
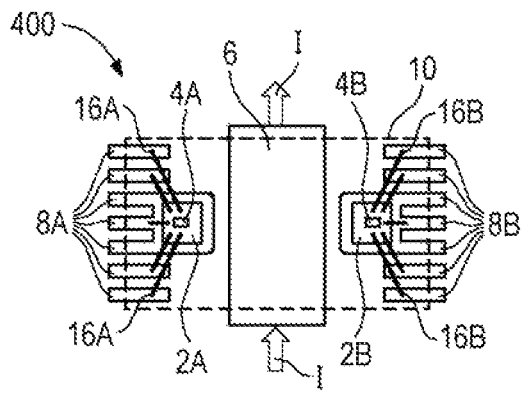

FIGS. 4A and 4B show a cross-sectional side view and a plan view, respectively, of the sensor device 400. The sensor device 400 can be at least partly similar to the sensor devices 100 and 200 in FIGS. 1 and 2 and have identical features. The sensor device 400 constitutes one example of how the sensor devices 100 and 200 in FIGS. 1 and 2 can be realized in the form of a sensor package or semiconductor package.

The sensor device 400 can comprise two magnetic field sensor chips 2A and 2B having sensor elements 4A and 4B and also a current conductor 6, wherein the components mentioned can be arranged relative to one another in particular in accordance with either of FIGS. 1 and 2. In this case, the upper main surfaces of the magnetic field sensor chips 2A and 2B and of the current conductor 6 can be arranged substantially parallel.

The sensor device 400 can furthermore comprise a leadframe or some other electrically conductive chip carrier from which the current conductor 6 and a plurality of connecting conductors 8A and 8B can be formed. The leadframe can be produced for example by structures of a metal sheet using mechanical sawing, laser beams, cutting, stamping, milling, etching, etc. By way of example, the leadframe can be produced from a copper alloy with an additional metal coating. In the example in FIG. 4, the two magnetic field sensor chips 2A and 2B can be arranged on one or more of the connecting conductors 8A and 8B, respectively. The sensor device 400 can be configured to be electrically and mechanically connected to a further component, in particular a printed circuit board (not shown), via the connecting conductors 8A and 8B.

The sensor device 400 can furthermore comprise a housing 10, in which components of the sensor device 400 can be encapsulated. In particular, the current conductor 6 and the two magnetic field sensor chips 2A and 2B can be arranged in the common housing. The current conductor 6 can thus be in particular a housing-internal current conductor. The housing 10 can be fabricated from at least one out of a mold compound, an epoxy or an epoxy resin, a filled epoxy, a glass-fiber-filled epoxy, an imide, a thermoplastic, a thermosetting polymer, a polymer mixture, a laminate, etc. Various techniques can be used for the production of the housing 10, for example at least one out of compression molding, injection molding, powder molding, liquid molding, map molding, laminating, etc.

In FIG. 4, the magnetic field sensor chips 2A and 2B can be electrically connected to the connecting conductors 8A and 8B, respectively, via bond wires 16, for example. In further examples, such an electrical connection can be provided by any other connection elements, for example by clips or tapes. The connecting conductors 8A and 8B can at least partly project from the housing 10, such that the magnetic field sensor chips 2A and 2B are electrically accessible from outside the housing 10. Analogously, the current conductor 6 can at least partly project from the housing 10 in order to provide an input and an output for a measurement current.

In the example in FIG. 4, the two magnetic field sensor chips 2A and 2B need not necessarily be electrically connected to one another within the housing 10. In such a case, the induced magnetic field and/or the measurement current can be calculated by a logic chip that can be arranged on the same printed circuit board (not shown) as the sensor device 400.

Figure 5:
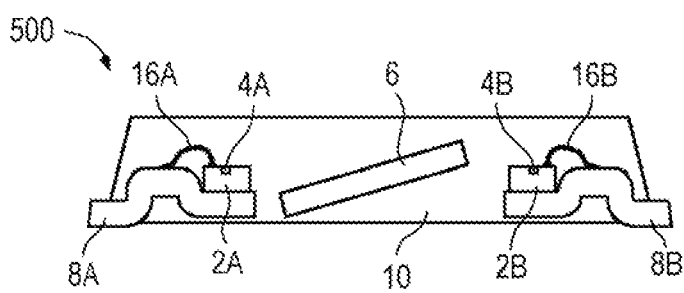
FIG. 5 shows a cross-sectional side view of a sensor device in accordance with the disclosure.

The sensor device 500 in FIG. 5 can be at least partly similar to the sensor devices 400 in FIG. 4 and have identical features. In contrast to FIG. 4, the current conductor 6 in FIG. 5 can be tilted relative to the upper main surfaces or the sensitivity directions of the magnetic field sensor chips 2A and 2B. In this context, the explanations concerning the sensor device 300 in FIG. 3 and associated equations can also hold true for the sensor device 500 in FIG. 5. In FIG. 5, the magnetic field sensor chips 2A and 2B can be arranged in particular on horizontal, planar sections of the connecting conductors 8A and 8B, respectively. Such an arrangement of the magnetic field sensor chips 2A and 2B can be realized using cost-effective planar placement techniques. A tilting of the current conductor 6 relative to the magnetic field sensor chips 2A and 2B can be realized for example by a bending of the current conductor 6 relative to the connecting conductors 8A and 8B.

Figure 6:
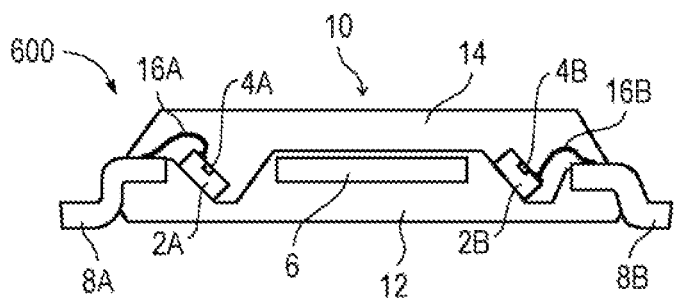
FIG. 6 shows a cross-sectional side view of a sensor device in accordance with the disclosure.

The sensor device 600 in FIG. 6 can be at least partly similar to the sensor device 300 in FIG. 3 and have identical features. The sensor device 600 constitutes one example of how the sensor device 300 in FIG. 3 can be realized in the form of a semiconductor package. In the example in FIG. 6, the leadframe forming the current conductor 6 and the connecting conductors 8A, 8B can be embedded in a mold compound 12. The leadframe can be a premolded leadframe. The top side of the mold compound 12 can have one or more horizontal areas and also one or more oblique areas. A tilting of the magnetic field sensor chips 2A and 2B relative to the current conductor 6 can be achieved by the magnetic field sensor chips 2A and 2B being arranged on oblique areas of the premolded leadframe.

In FIG. 6, the housing 10 of the sensor device 600 can be formed by the mold compound 12 and an encapsulation material 14 arranged over the mold compound. The encapsulation material 14 can encapsulate the magnetic field sensor chips 2A and 2B arranged on the premolded leadframe. The encapsulation material 14 can be produced from one of the materials mentioned above in association with the housing 10.

Figure 7:
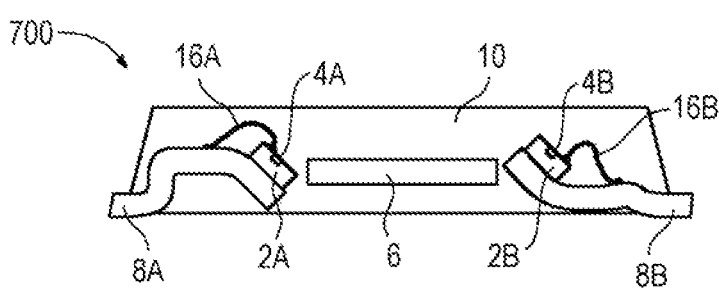
FIG. 7 shows a cross-sectional side view of a sensor device in accordance with the disclosure.

The sensor device 700 in FIG. 7 can for example be at least partly similar to the sensor device 400 in FIG. 4 and have identical features. Analogously to FIG. 4, the two magnetic field sensor chips 2A and 2B can be arranged on connecting conductors 8A and 8B, respectively. In contrast to FIG. 4, the magnetic field sensor chips 2A and 2B can be tilted by tilt angles relative to the current conductor 6. The two tilt angles can be provided by a bending of the connecting conductors 8A and 8B relative to the current conductor 6.

Figure 8A:
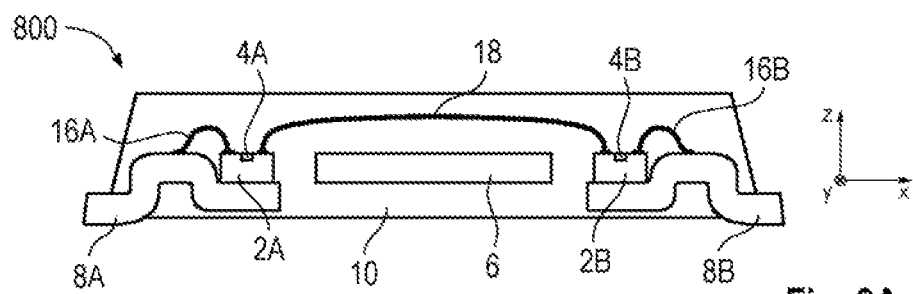
FIGS. 8A and 8B show a cross-sectional side view and a plan view, respectively, of a sensor device in accordance with the disclosure.
Figure 8B:
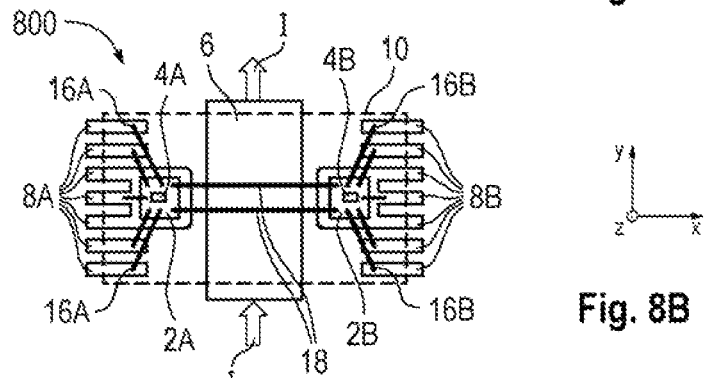

The sensor device 800 in FIG. 8 can be at least partly similar to the sensor device 400 in FIG. 4 and have identical features. The magnetic field sensor chips 2A and 2B can be electrically connected to one another via one or more electrical connection elements 18. In FIG. 8, such a housing-internal chip-to-chip connection can be provided by bond wires and/or tapes, for example. Magnetic field components detected by the magnetic field sensor chips 2A and 2B can be exchanged between one another via the connection. A calculation of, for example, the induced magnetic field or the measurement current can then be performed by one or both of the magnetic field sensor chips 2A and 2B.

Figure 9:
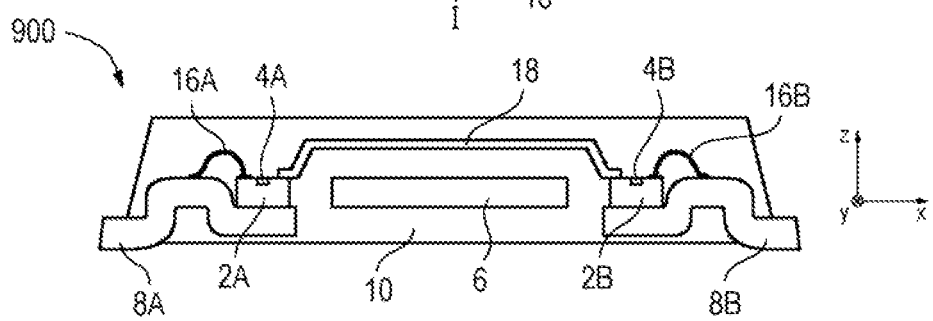
FIG. 9 shows a cross-sectional side view of a sensor device in accordance with the disclosure.

The sensor device 900 in FIG. 9 can be at least partly similar to the sensor device 800 in FIG. 8 and have identical features. In contrast to FIG. 8, the electrical connection elements 18 in the sensor device 900 can be embodied by one or more clips.

Figure 10A:
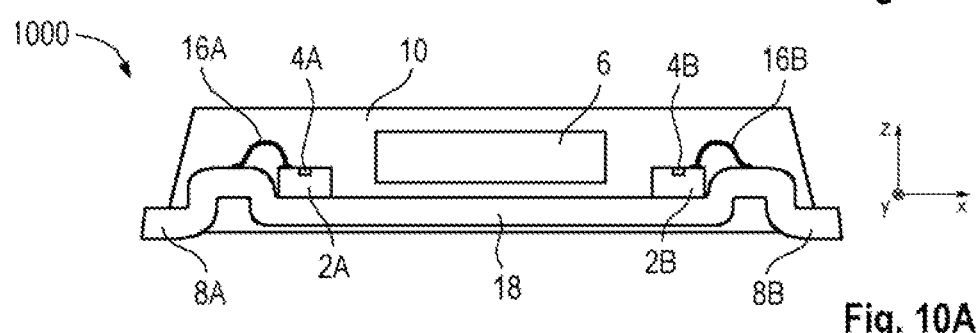
FIGS. 10A and 10B show a cross-sectional side view and a plan view, respectively, of a sensor device in accordance with the disclosure.
Figure 10B:
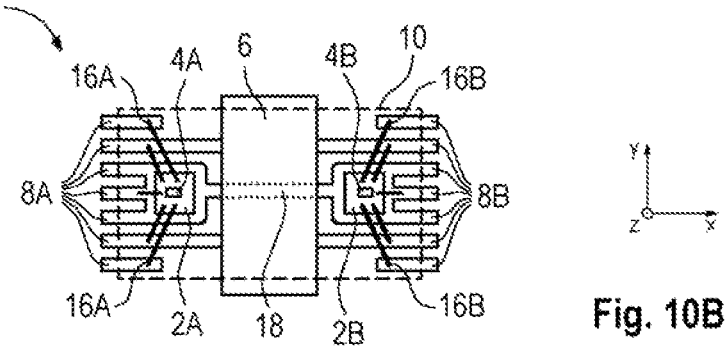

The sensor device 1000 in FIG. 10 can be at least partly similar to the sensor device 800 in FIG. 8 and have identical features. In contrast to FIG. 8, the electrical connection elements 18 in the sensor device 1000 can be formed by one or more sections of the leadframe. In FIG. 10, the housing-internal chip-to-chip connection can be provided in particular via sections of the leadframe running below the current conductor 6.

Figure 11:
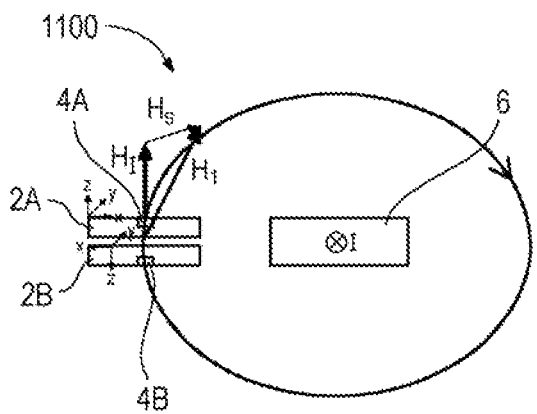
FIG. 11 shows a cross-sectional side view of a sensor device in accordance with the disclosure.

The sensor device 1100 in FIG. 11 can for example be at least partly similar to the sensor device 200 in FIG. 2 and have identical features. In contrast to FIG. 2, in the sensor device 1100, the two magnetic field sensor chips 2A and 2B can be arranged next to the current conductor 6 on a same side of the current conductor 6. The sensitivity directions of the two magnetic field sensor chips 2A and 2B can each run perpendicular to a main surface of the respective magnetic field sensor chip and in opposite z-directions. The lower second magnetic field sensor chip 2B can thus be turned over relative to the upper first magnetic field sensor chip 2A. In the example shown, the main surfaces of the magnetic field sensor chips 2A and 2B can be arranged substantially parallel to the current conductor 6.

The magnetic field $H_1$ detected by the first magnetic field sensor chip 2A in the case of the first sensor element 4A can result as:

$$H_1 = \begin{pmatrix} H_{1x} \\ H_{1y} \\ H_{1z} \end{pmatrix} = \begin{pmatrix} 0 \\ 0 \\ H_I \end{pmatrix} + \begin{pmatrix} H_{S1x} \\ H_{S1y} \\ H_{S1z} \end{pmatrix} \qquad (24)$$

Analogously, the magnetic field $H_2$ detected by the second magnetic field sensor chip 2B in the case of the second sensor element 4B can result as $$H_2 = \begin{pmatrix} H_{2x} \\ H_{2y} \\ H_{2z} \end{pmatrix} = \begin{pmatrix} 0 \\ 0 \\ -H_I \end{pmatrix} + (a+1)\begin{pmatrix} -H_{S1x} \\ H_{S1y} \\ -H_{S1z} \end{pmatrix} \qquad (25)$$

Proceeding from equations (24) and (25), the induced magnetic field $H_I$ can be determined as $$H_I = \frac{H_{1z}H_{2x} - H_{2z}H_{1x}}{H_{1x} + H_{2x}} \qquad (26)$$

Based on equation (26), the sensor device 1100 can be configured to determine the induced magnetic field $H_1$ based on the x- and z-components of the magnetic fields $H_1$ and $H_2$ detected by the magnetic field sensor chips 2A and 2B, wherein the influence of the inhomogenous magnetic stray field $H_s$ on a measurement result can be compensated for. Furthermore, the measurement current I can be determined by way of the proportionality $I \sim H_1$. Analogously to preceding examples, the sensor device 1100 can furthermore be configured to determine the induced magnetic field $H_1$ based on the y- and z-components of the magnetic fields $H_1$ and $H_2$ detected by the magnetic field sensor chips 2A and 2B. As already discussed in association with preceding examples, the sensor device 200 can furthermore be configured to decide whether the induced magnetic field $H_I$ and/or the measurement current I ought to be determined either based on the detected x- and z-components of the magnetic fields $H_1$ and $H_2$ or based on the detected y- and z-components of the magnetic fields $H_1$ and $H_2$.

Figure 12:
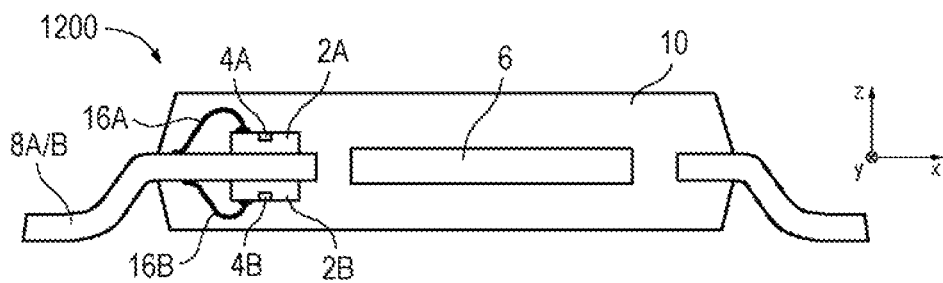
FIG. 12 shows a cross-sectional side view of a sensor device in accordance with the disclosure.

The sensor device 1200 in FIG. 12 can be at least partly similar to the sensor device 1100 in FIG. 11 and have identical features. The sensor device 1200 constitutes one example of how the sensor device 1100 in FIG. 11 can be realized in the form of a semiconductor package. The two magnetic field sensor chips 2A and 2B can be arranged for example on connecting conductors 8A and 8B, respectively. In the side view in FIG. 12, a front connecting conductor can conceal connecting conductors situated behind it.

In the examples in FIGS. 11 and 12, the main surfaces of the magnetic field sensor chips 2A and 2B can be oriented substantially parallel to the current conductor 6. In further examples, the magnetic field sensor chips 2A and 2B can be tilted relative to the current conductor 6, as described for example in association with the example in FIG. 3. Such a relative tilting can be provided for example by tilting/bending of the connecting conductors 8A and 8B and/or by tilting/bending of the current conductor 6. If a relative tilting between these components is present, a calculation of the induced magnetic field and of the measurement current can be carried out based on the equations discussed in association with FIG. 3.

Figure 13:
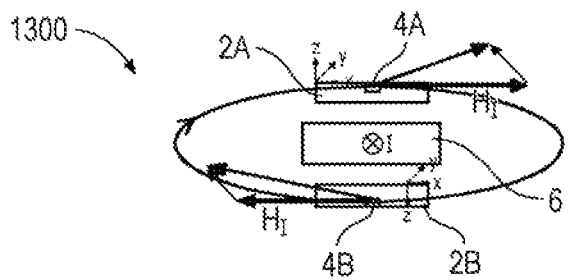
FIG. 13 shows a cross-sectional side view of a sensor device in accordance with the disclosure.

The sensor device 1300 in FIG. 13 can be at least partly similar to preceding sensor devices in accordance with the disclosure and have identical features. In the preceding examples, each of the sensor elements 4A and 4B could correspond in particular to a Hall sensor element. In contrast thereto, the sensor elements 4A and 4B of the sensor device 1300 can each correspond to a magnetoresistive sensor element or to a vertical Hall sensor element or to a fluxgate sensor element. The sensor elements 4A and 4B can be for example magnetoresistive xMR sensor elements, in particular AMR sensor elements, GMR sensor elements or TMR sensor elements. Since the sensor elements mentioned can be sensitive in particular with respect to an "in-plane" magnetic field component, the sensor elements 4A and 4B can be aligned with the current conductor 6. In other words, the sensor elements 4A and 4B can be arranged directly over the current conductor 6 and thus directly over the course of the measurement current. That is to say that, as viewed in the vertical direction, the current conductor 6 and the sensor elements 4A and 4B can in each case overlap (in particular completely).

The magnetic field $H_1$ detected by the first magnetic field sensor chip 2A in the case of the first sensor element 4A can result as $$H_1 = \begin{pmatrix} H_{1x} \\ H_{1y} \\ H_{1z} \end{pmatrix} = \begin{pmatrix} H_I \\ 0 \\ 0 \end{pmatrix} + \begin{pmatrix} H_{S1x} \\ H_{S1y} \\ H_{S1z} \end{pmatrix} \tag{27}$$

Analogously, the magnetic field $H_2$ detected by the second magnetic field sensor chip 2B in the case of the second sensor element 4B can result as $$H_2 = \begin{pmatrix} H_{2x} \\ H_{2y} \\ H_{2z} \end{pmatrix} = \begin{pmatrix} -H_I \\ 0 \\ 0 \end{pmatrix} + (a+1)\begin{pmatrix} H_{S1x} \\ H_{S1y} \\ -H_{S1z} \end{pmatrix} \tag{28}$$

Proceeding from equations (27) and (28), the induced magnetic field $H_I$ can be determined as $$I \sim H_I = \frac{H_{1z}H_{2x} - H_{2z}H_{1x}}{H_{1z} - H_{2z}} \tag{29}$$

Analogously to preceding examples, the sensor device 1300 can accordingly likewise also be configured to compensate for an influence of an inhomogenous magnetic stray field. In the case of a homogenous magnetic stray field, e.g. for the condition a=0, the following can hold true:

$$H_I = \frac{H_{1x} - H_{2x}}{2} \tag{30}$$

Figure 14:
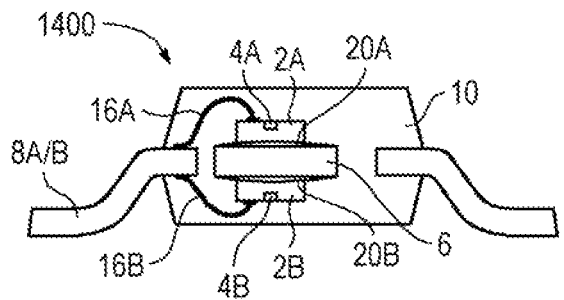
FIG. 14 shows a cross-sectional side view of a sensor device in accordance with the disclosure.

The sensor device 1400 in FIG. 14 can be at least partly similar to the sensor device 1300 in FIG. 13 and have identical features. The sensor device 1400 constitutes one example of how the sensor device 1300 in FIG. 13 can be realized in the form of a semiconductor package. The two magnetic field sensor chips 2A and 2B can be arranged for example on opposite main surfaces of the current conductor 6. In this case, the magnetic field sensor chips 2A and 2B can be electrically insulated from the current conductor 6 by an insulation material 20A and 20B, respectively.

Figure 15:
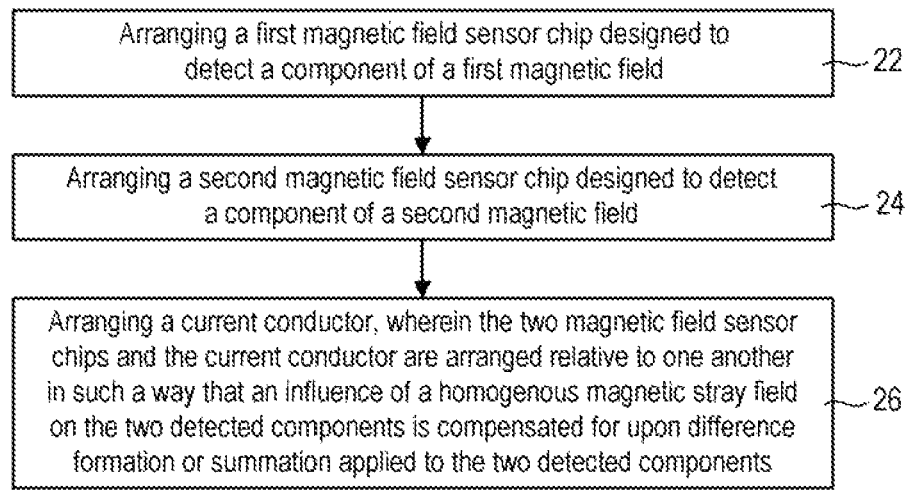
FIG. 15 shows a flow diagram of a method for producing a sensor device in accordance with the disclosure.

FIG. 15 shows a flow diagram of a method for producing a sensor device in accordance with the disclosure. The method can be used for example to fabricate each of the sensor devices described herein in accordance with the disclosure. The method in FIG. 15 can be read in conjunction with any of the preceding figures.

22 can involve arranging a first magnetic field sensor chip having a first sensor element. The first magnetic field sensor chip can be configured to detect a first component of a first magnetic field at the location of the first sensor element with respect to a first sensitivity direction. 24 can involve arranging a second magnetic field sensor chip separated from the first magnetic field sensor chip and having a second sensor element. The second magnetic field sensor chip can be configured to detect a first component of a second magnetic field at the location of the second sensor element with respect to the first sensitivity direction. 26 can involve arranging a current conductor configured to carry a measurement current, wherein the measurement current induces a magnetic field at the locations of the two sensor elements. The two magnetic field sensor chips and the current conductor can be arranged relative to one another in such a way that an influence of a homogenous magnetic stray field on the two detected first components is compensated for upon difference formation or summation applied to the two detected first components.

Figure 16:
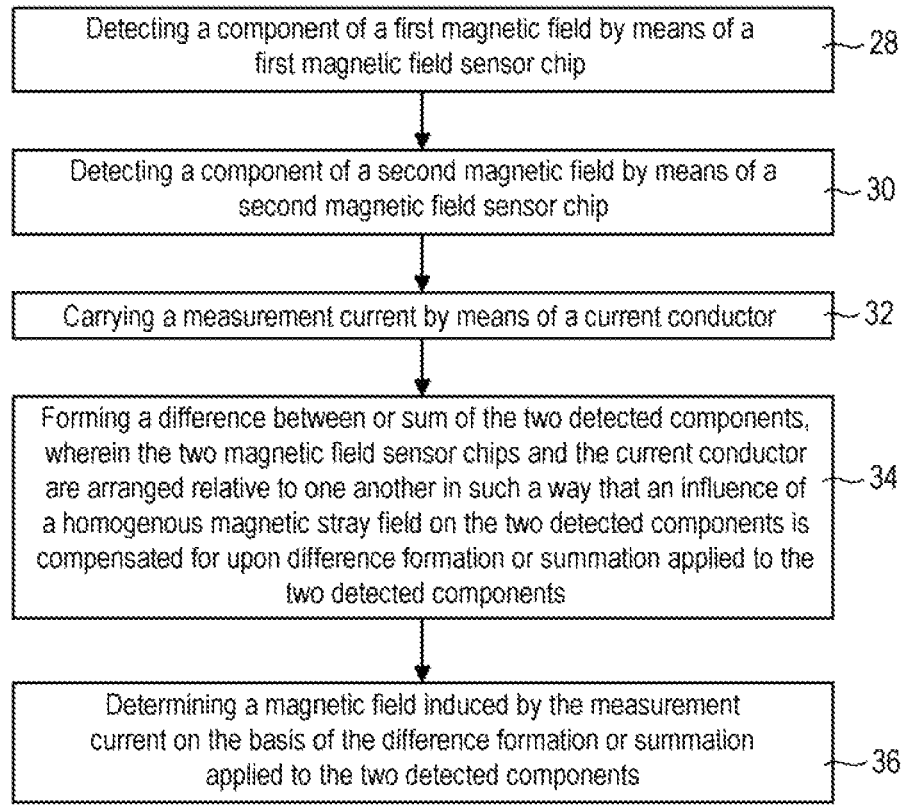
FIG. 16 shows a flow diagram of a method for determining a measurement current in accordance with the disclosure.

FIG. 16 shows a flow diagram of a method for determining a measurement current in accordance with the disclosure. The method can be carried out for example by any of the sensor devices described herein in accordance with the disclosure. The method in FIG. 16 can be read in conjunction with any of the preceding figures.

28 can involve detecting a first component of a first magnetic field at the location of a first sensor element of a first magnetic field sensor chip with respect to a first sensitivity direction. 30 can involve detecting a first component of a second magnetic field at the location of a second sensor element of a second magnetic field sensor chip, separated from the first magnetic field sensor chip, with respect to the first sensitivity direction. 32 can involve carrying a measurement current using a current conductor, wherein the measurement current induces a magnetic field at the locations of the two sensor elements. 34 can involve forming a difference between or sum of the two detected first components. The two magnetic field sensor chips and the current conductor can be arranged relative to one another in such a way that an influence of a homogenous magnetic stray field on the two detected first components is compensated for upon difference formation or summation applied to the two detected first components. 36 can involve determining the magnetic field induced by the measurement current based on the difference formation or summation applied to the two detected first components.

ASPECTS

Sensor devices, methods for producing a sensor device and methods for determining a measurement current are explained below based on aspects.

Aspect 1 is a sensor device, comprising:
a first magnetic field sensor chip having a first sensor element, wherein the first magnetic field sensor chip is configured to detect a first component of a first magnetic field at the location of the first sensor element with respect to a first sensitivity direction; a second magnetic field sensor chip separated from the first magnetic field sensor chip and having a second sensor element, wherein the second magnetic field sensor chip is configured to detect a first component of a second magnetic field at the location of the second sensor element with respect to the first sensitivity direction; and a current conductor configured to carry a measurement current, wherein the measurement current induces a magnetic field at the locations of the two sensor elements, wherein the two magnetic field sensor chips and the current conductor are arranged relative to one another in such a way that an influence of a homogeneous magnetic stray field on the two detected first components is compensated for upon difference formation or summation applied to the two detected first components.

Aspect 2 is a sensor device in accordance with aspect 1, wherein the sensor device under the influence of the homogeneous magnetic stray field is configured to determine the magnetic field induced by the measurement current based on the difference formation or summation applied to the two detected first components.

Aspect 3 is a sensor device in accordance with aspect 1 or 2, wherein: the first magnetic field sensor chip is configured to detect a second component of the first magnetic field at the location of the first sensor element with respect to a second sensitivity direction, and the second magnetic field sensor chip is configured to detect a second component of the second magnetic field at the location of the second sensor element with respect to the second sensitivity direction.

Aspect 4 is a sensor device in accordance with aspect 3, wherein the sensor device under the influence of an inhomogeneous magnetic stray field is configured to determine the induced magnetic field based on the detected first components and second components of the first magnetic field and second magnetic field.

Aspect 5 is a sensor device in accordance with aspect 4, wherein the sensor device under the influence of the inhomogeneous magnetic stray field is configured to determine the induced magnetic field based on the difference formation or summation applied to the two detected first components and based on a correction term, wherein the correction term is based on the detected first components and second components of the first magnetic field and second magnetic field.

Aspect 6 is a sensor device in accordance with any of aspects 3 to 5, wherein: the first magnetic field sensor chip is configured to detect a third component of the first magnetic field at the location of the first sensor element with respect to a third sensitivity direction, the second magnetic field sensor chip is configured to detect a third component of the second magnetic field at the location of the second sensor element with respect to the third sensitivity direction, and the sensor device under the influence of the inhomogeneous magnetic stray field is configured to determine the induced magnetic field based on the detected first components and third components of the first magnetic field and second magnetic field.

Aspect 7 is a sensor device in accordance with aspect 6, wherein the sensor device is configured to decide, based on the detected second component of the first magnetic field and the detected third component of the first magnetic field, whether the induced magnetic field is determined based on the detected first components and second components of the first magnetic field and second magnetic field or based on the detected first components and third components of the first magnetic field and second magnetic field.

Aspect 8 is a sensor device in accordance with any of the preceding aspects, wherein the current conductor is arranged between the two magnetic field sensor chips.

Aspect 9 is a sensor device in accordance with any of aspects 1 to 7, wherein the two magnetic field sensor chips are arranged next to the current conductor on a same side of the current conductor.

Aspect 10 is a sensor device in accordance with any of the preceding aspects, wherein: the first sensitivity direction runs substantially perpendicular to a first main surface of the first magnetic field sensor chip and substantially perpendicular to a second main surface of the second magnetic field sensor chip, and the first main surface, the second main surface and the current conductor are arranged substantially parallel to one another.

Aspect 11 is a sensor device in accordance with any of aspects 1 to 9, wherein: the first sensitivity direction runs substantially perpendicular to a first main surface of the first magnetic field sensor chip and substantially perpendicular to a second main surface of the second magnetic field sensor chip, the first main surface and the current conductor are tilted relative to one another by a first tilt angle, and the second main surface and the current conductor are tilted relative to one another by a second tilt angle.

Aspect 12 is a sensor device in accordance with aspect 11, wherein the two tilt angles each have a value of approximately 45 degrees.

Aspect 13 is a sensor device in accordance with aspect 11 or 12, wherein: the two magnetic field sensor chips are arranged on connecting conductors of a leadframe, and the two tilt angles are provided by a bending of the current conductor relative to the connecting conductors.

Aspect 14 is a sensor device in accordance with aspect 11 or 12, wherein: the two magnetic field sensor chips are arranged on connecting conductors of a leadframe, and the two tilt angles are provided by a bending of the connecting conductors relative to the current conductor.

Aspect 15 is a sensor device in accordance with aspect 11 or 12, wherein the two tilt angles are provided by oblique surfaces of a premolded leadframe on which the magnetic field sensor chips are arranged.

Aspect 16 is a sensor device in accordance with any of aspects 1 to 12, wherein the two magnetic field sensor chips are arranged on opposite main surfaces of the current conductor.

Aspect 17 is a sensor device in accordance with any of the preceding aspects, wherein the current conductor and the two magnetic field sensor chips are arranged in a common housing.

Aspect 18 is a sensor device in accordance with aspect 17, wherein the two magnetic field sensor chips are electrically connected to one another within the common housing.

Aspect 19 is a sensor device in accordance with any of the preceding aspects, wherein each of the two sensor elements is a Hall sensor element.

Aspect 20 is a method for producing a sensor device, wherein the method comprises: arranging a first magnetic field sensor chip having a first sensor element, wherein the first magnetic field sensor chip is configured to detect a first component of a first magnetic field at the location of the first sensor element with respect to a first sensitivity direction; arranging a second magnetic field sensor chip separated from the first magnetic field sensor chip and having a second sensor element, wherein the second magnetic field sensor chip is configured to detect a first component of a second magnetic field at the location of the second sensor element with respect to the first sensitivity direction; and arranging a current conductor configured to carry a measurement current, wherein the measurement current induces a magnetic field at the locations of the two sensor elements, wherein the two magnetic field sensor chips and the current conductor are arranged relative to one another in such a way that an influence of a homogeneous magnetic stray field on the two detected first components is compensated for upon difference formation or summation applied to the two detected first components.

Aspect 21 is a method for determining a measurement current, wherein the method comprises: detecting a first component of a first magnetic field at the location of a first sensor element of a first magnetic field sensor chip with respect to a first sensitivity direction; detecting a first component of a second magnetic field at the location of a second sensor element of a second magnetic field sensor chip, separated from the first magnetic field sensor chip, with respect to the first sensitivity direction; carrying a measurement current using a current conductor, wherein the measurement current induces a magnetic field at the locations of the two sensor elements; forming a difference between or sum of the two detected first components, wherein the two magnetic field sensor chips and the current conductor are arranged relative to one another in such a way that an influence of a homogeneous magnetic stray field on the two detected first components is compensated for upon the difference formation or summation applied to the two detected first components; and determining the magnetic field induced by the measurement current based on the difference formation or summation applied to the two detected first components.

Although specific implementations have been illustrated and described herein, it is obvious to a person skilled in the art that a multiplicity of alternative and/or equivalent implementations can replace the specific implementations shown and described, without departing from the scope of the present disclosure. This application is intended to cover all adaptations or variations of the specific implementations discussed herein. Therefore, the intention is for this disclosure to be restricted only by the claims and the equivalents thereof.

What is claimed is:

1. A sensor device, comprising:
a first magnetic field sensor chip having a first sensor element, wherein the first magnetic field sensor chip is configured to detect a first component of a first magnetic field at a location of the first sensor element with respect to a first sensitivity direction;
a second magnetic field sensor chip separated from the first magnetic field sensor chip and having a second sensor element, wherein the second magnetic field sensor chip is configured to detect a first component of a second magnetic field at a location of the second sensor element with respect to the first sensitivity direction; and
a current conductor configured to carry a measurement current, wherein the measurement current induces a magnetic field at the location of the first sensor element and at the location of the second sensor element,
wherein the first magnetic field sensor chip, the second magnetic field sensor chip, and the current conductor are arranged relative to one another in such a way that an influence of a homogeneous magnetic stray field on the detected first component of the first magnetic field and the detected first component of the second magnetic field are compensated for upon difference formation or summation applied to the detected first component of the first magnetic field and the detected first component of the second magnetic field.

2. The sensor device as claimed in claim 1, wherein the sensor device under the influence of the homogeneous magnetic stray field is configured to determine the magnetic field induced by the measurement current based on the difference formation or the summation applied to the detected first component of the first magnetic field and the detected first component of the second magnetic field.

3. The sensor device as claimed in claim 1, wherein:
the first magnetic field sensor chip is configured to detect a second component of the first magnetic field at the location of the first sensor element with respect to a second sensitivity direction, and
the second magnetic field sensor chip is configured to detect a second component of the second magnetic field at the location of the second sensor element with respect to the second sensitivity direction.

4. The sensor device as claimed in claim 3, wherein the sensor device under an influence of an inhomogeneous magnetic stray field is configured to determine the induced magnetic field based on the detected first component of the first magnetic field, the detected second component of the first magnetic field, the detected first component of the second magnetic field, and the detected second component of the second magnetic field.

5. The sensor device as claimed in claim 4, wherein the sensor device under the influence of the inhomogeneous magnetic stray field is configured to determine the induced magnetic field based on the difference formation or the summation applied to the detected first component of the first magnetic field and the detected first component of the second magnetic field based on a correction term, wherein the correction term is based on the detected first component of the first magnetic field, the detected second component of the first magnetic field, the detected first component of the second magnetic field, and the detected second component of the second magnetic field.

6. The sensor device as claimed in claim 3, wherein:
the first magnetic field sensor chip is configured to detect a third component of the first magnetic field at the location of the first sensor element with respect to a third sensitivity direction,
the second magnetic field sensor chip is configured to detect a third component of the second magnetic field at the location of the second sensor element with respect to the third sensitivity direction, and
the sensor device under the influence of an inhomogeneous magnetic stray field is configured to determine the induced magnetic field based on the detected first component of the first magnetic field, the detected third component of the first magnetic field, the detected first component of the second magnetic field, and the detected third component of the second magnetic field.

7. The sensor device as claimed in claim 6, wherein the sensor device is configured to decide, based on the detected second component of the first magnetic field and the detected third component of the first magnetic field, whether the induced magnetic field is determined based on:
the detected first component of the first magnetic field, the detected second component of the first magnetic field, the detected first component of the second magnetic field, and the detected second component of the second magnetic field, or
the detected first component of the first magnetic field, the detected third component of the first magnetic field, the detected first component of the second magnetic field, and the detected third component of the second magnetic field.

8. The sensor device as claimed in claim 1, wherein the current conductor is arranged between the first magnetic field sensor chip and the second magnetic field sensor chip.

9. The sensor device as claimed in claim 1, wherein the first magnetic field sensor chip and the second magnetic field sensor chip are arranged next to the current conductor on a same side of the current conductor.

10. The sensor device as claimed in claim 1, wherein:
the first sensitivity direction runs substantially perpendicular to a first main surface of the first magnetic field sensor chip and substantially perpendicular to a second main surface of the second magnetic field sensor chip, and
the first main surface, the second main surface, and the current conductor are arranged substantially parallel to one another.

11. The sensor device as claimed in claim 1, wherein:
the first sensitivity direction runs substantially perpendicular to a first main surface of the first magnetic field sensor chip and substantially perpendicular to a second main surface of the second magnetic field sensor chip,
the first main surface and the current conductor are tilted relative to one another by a first tilt angle, and
the second main surface and the current conductor are tilted relative to one another by a second tilt angle.

12. The sensor device as claimed in claim 11, wherein the first tilt angle and the second tilt angle each have a value of approximately 45 degrees.

13. The sensor device as claimed in claim 11, wherein:
the first magnetic field sensor chip and the second magnetic field sensor chip are arranged on connecting conductors of a leadframe, and
the first tilt angle and the second tilt angle are provided by a bending of the current conductor relative to the connecting conductors.

14. The sensor device as claimed in claim 11, wherein:
the first magnetic field sensor chip and the second magnetic field sensor chip are arranged on connecting conductors of a leadframe, and
the first tilt angle and the second tilt angle are provided by a bending of the connecting conductors relative to the current conductor.

15. The sensor device as claimed in claim 11, wherein the first tilt angle and the second tilt angle are provided by oblique surfaces of a premolded leadframe on which the first magnetic field sensor chip and the second magnetic field sensor chip are arranged.

16. The sensor device as claimed in claim 1, wherein the first magnetic field sensor chip and the second magnetic field sensor chip are arranged on opposite main surfaces of the current conductor.

17. The sensor device as claimed in claim 1, wherein the current conductor and the first magnetic field sensor chip and the second magnetic field sensor chip are arranged in a common housing.

18. The sensor device as claimed in claim 17, wherein the first magnetic field sensor chip and the second magnetic field sensor chip are electrically connected to one another within the common housing.

19. A method for producing a sensor device, wherein the method comprises:
arranging a first magnetic field sensor chip having a first sensor element, wherein the first magnetic field sensor chip is configured to detect a first component of a first magnetic field at a location of the first sensor element with respect to a first sensitivity direction;
arranging a second magnetic field sensor chip separated from the first magnetic field sensor chip and having a second sensor element, wherein the second magnetic field sensor chip is configured to detect a first component of a second magnetic field at a location of the second sensor element with respect to the first sensitivity direction; and
arranging a current conductor configured to carry a measurement current, wherein the measurement current induces a magnetic field at the location of the first sensor element and the location of the second sensor element,
wherein the two magnetic field sensor chips and the current conductor are arranged relative to one another in such a way that an influence of a homogeneous magnetic stray field on the two detected first components is compensated for upon difference formation or summation applied to the two detected first components.

20. A method for determining a measurement current, wherein the method comprises:
detecting a first component of a first magnetic field at a location of a first sensor element of a first magnetic field sensor chip with respect to a first sensitivity direction;
detecting a first component of a second magnetic field at a location of a second sensor element of a second magnetic field sensor chip, separated from the first magnetic field sensor chip, with respect to the first sensitivity direction;
carrying a measurement current via a current conductor, wherein the measurement current induces a magnetic field at the location of the first sensor element and the location of the second sensor element, forming a difference between or a sum of the detected first component of the first magnetic field and the detected first component of the second magnetic field, wherein the first magnetic field sensor chip, the second magnetic field sensor chip, and the current conductor are arranged relative to one another in such a way that an influence of a homogeneous magnetic stray field on the detected first component of the first magnetic field and the detected first component of the second magnetic field is compensated for upon a difference formation or a summation applied to the detected first component of the first magnetic field and the detected first component of the second magnetic field; and determining the magnetic field induced by the measurement current based on the difference formation or the summation applied to the detected first component of the first magnetic field and the detected first component of the second magnetic field.

* * * * *